(12) United States Patent
Divakaruni et al.

(10) Patent No.: US 6,261,914 B1
(45) Date of Patent: Jul. 17, 2001

(54) PROCESS FOR IMPROVING LOCAL UNIFORMITY OF CHEMICAL MECHANICAL POLISHING USING A SELF-ALIGNED POLISH RATE ENHANCEMENT LAYER

(75) Inventors: Ramachandra Divakaruni, Middletown, NY (US); Jeffrey Peter Gambino, Westford, VT (US); Carl J. Radens, LaGrangeville; Jeremy K. Stephens, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/361,961

(22) Filed: Jul. 27, 1999

(51) Int. Cl.$^7$ .................................................. H01L 21/331
(52) U.S. Cl. .......................................... 438/359; 438/360
(58) Field of Search ...................................... 438/359, 361

(56) References Cited

U.S. PATENT DOCUMENTS

| | | |
|---|---|---|
| 4,962,064 | 10/1990 | Haskell et al. . |
| 5,192,706 | 3/1993 | Rodder . |
| 5,362,669 | 11/1994 | Boyd et al. . |
| 5,459,096 | 10/1995 | Venkatesan et al. . |
| 5,494,857 | 2/1996 | Cooperman et al. . |
| 5,516,625 | 5/1996 | McNamara et al. . |
| 5,665,202 | 9/1997 | Subramanian et al. . |
| 5,691,215 | 11/1997 | Dai et al. . |
| 5,728,621 | 3/1998 | Zheng et al. . |
| 5,733,801 | 3/1998 | Gojohbori . |
| 5,786,262 | 7/1998 | Jang et al. . |
| 6,017,803 | * 1/2000 | Wong ..................................... 438/430 |
| 6,150,212 | * 11/2000 | Divakaruni et al. .................. 438/244 |

* cited by examiner

Primary Examiner—Richard Booth
Assistant Examiner—Lynne A. Gurley
(74) Attorney, Agent, or Firm—McGinn & Gibb, PLLC (57) ABSTRACT

A method for making a semiconductor device, includes forming an oxide layer on a silicon substrate, forming a nitride layer over the oxide layer; depositing one of a doped oxide layer and an undoped porous oxide layer on the nitride layer, etching trenches through the one of the doped layer and the undoped porous oxide layer, the nitride layer, and the oxide layer, depositing an undoped oxide layer to fill the trenches, and patterning the undoped oxide by chemical mechanical polishing (CMP).

20 Claims, 8 Drawing Sheets

PROCESS FOR IMPROVING LOCAL UNIFORMITY OF CHEMICAL MECHANICAL POLISHING USING A SELF-ALIGNED POLISH RATE ENHANCEMENT LAYER

BACKGROUND OF THE INVENTION

1. Field of the Invention

The present invention generally relates to a method for producing a semiconductor device, and more particularly to a method for improving uniformity of a chemical mechanical polishing (CMP) operation used in producing the semiconductor device.

2. Description of the Related Art

Conventional systems utilize shallow trench isolation (STI) in advanced integrated circuits to electrically isolate neighboring devices. Chemical mechanical polishing (CMP) is often used to pattern insulators in semiconductor trenches or conductors in insulating trenches. In many applications, the polishing is stopped only after all the material has been removed from the field regions.

However, oftentimes this operation results in overpolishing of the material in wide trenches.

Figure 1A:
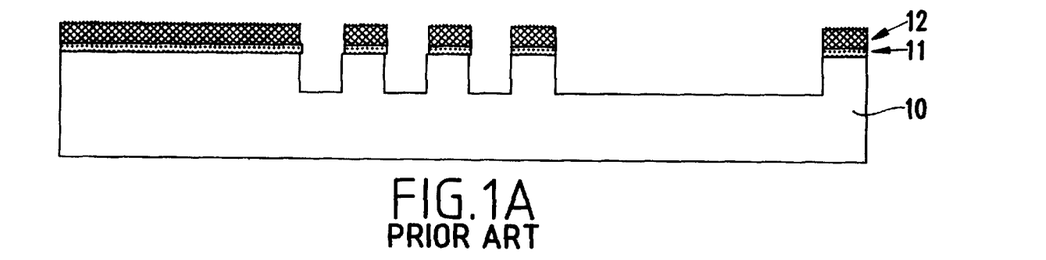
FIGS. 1A–1D illustrate a conventional process of forming a semiconductor device.

For example, FIGS. 1A–1D illustrate a conventional process which is relatively simple, and is extendable to sub-quarter micron dimensions. In FIG. 1A, a pad oxide 11 is grown by thermal oxidation of a silicon substrate 10. Thereafter, a pad nitride, formed for example of SiN 12, is deposited on the $SiO_2$ layer. Then, the trenches are etched.

Figure 1B:
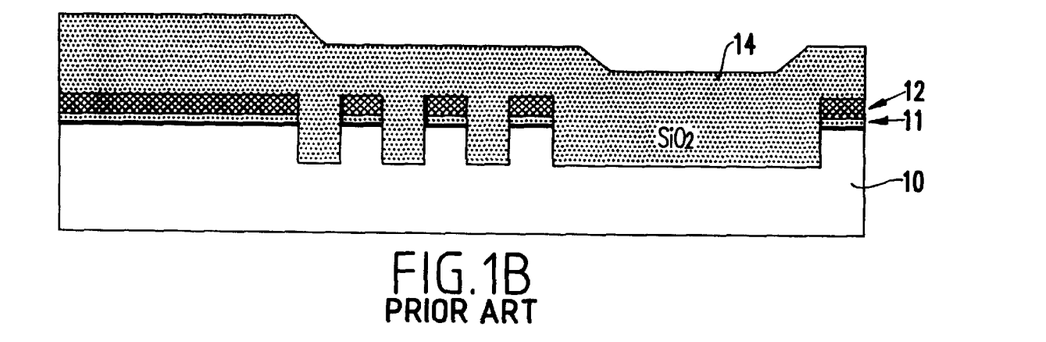

In FIG. 1B, a $SiO_2$ layer 14 is deposited to fill the trenches.

Figure 1C:
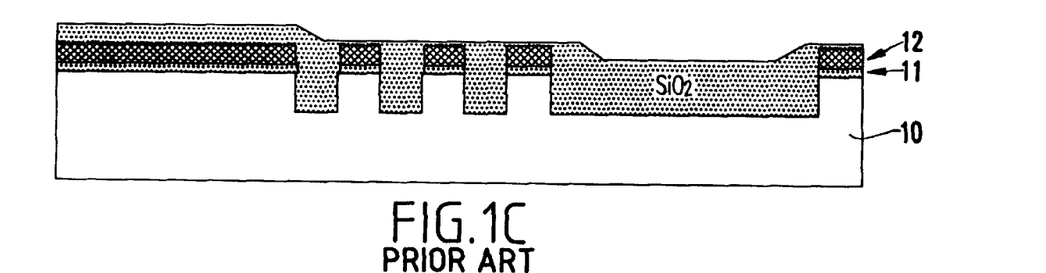

In step 1C, the $SiO_2$ layer 14 is patterned by CMP.

Figure 1D:
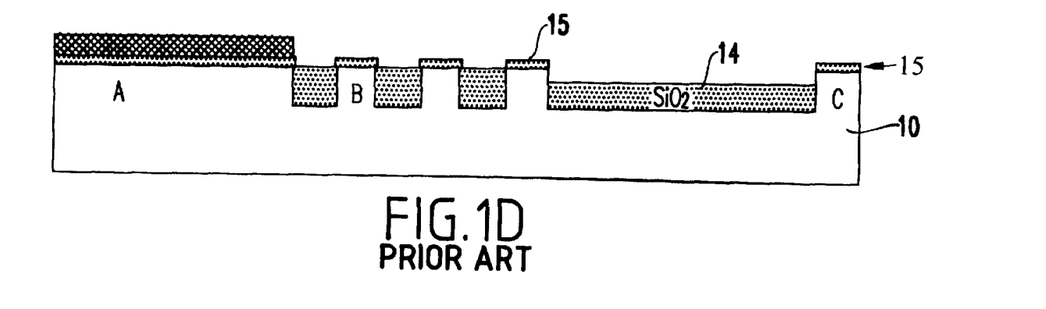

Finally in step 1D, the pad nitride and pad oxide are stripped, and a sacrificial oxide 15 is grown.

However, a problem with the conventional process is that the polishing process used to pattern the $SiO_2$ isolation, as shown in FIG. 1C, may result in localized variations in the $SiO_2$ thickness. This is a problem, and could result in the resulting device "failing" during operation.

That is, in regions where the trenches are wide or the density of the active area is low, such as in region C of FIG. 1D, there is excessive thinning of the $SiO_2$. The excessive oxide thinning allows the gate to wrap around the active areas, resulting in a low threshold voltage for the affected devices. Again, this may cause the device(s) to fail.

Moreover, in regions where the active areas are wide or where there is a low density of trenches, there may be insufficient removal of the $SiO_2$ such as in region A in FIG. 1D. The residual $SiO_2$ masks the pad nitride strip, and the pad nitride blocks subsequent implants and gate oxide growth, resulting in failing devices.

Localized variations in polishing resulting from variations in the pattern factor are also observed for other CMP processes. For example, such processes include metal CMP to produce damascene interconnects (e.g., see FIGS. 3A–3C described below) or studs, dielectric planarization over a gate stack (e.g., see FIGS. 5A–5C described below) or a metal stack, and polysilicon patterning in deep trenches.

Figure 3A:
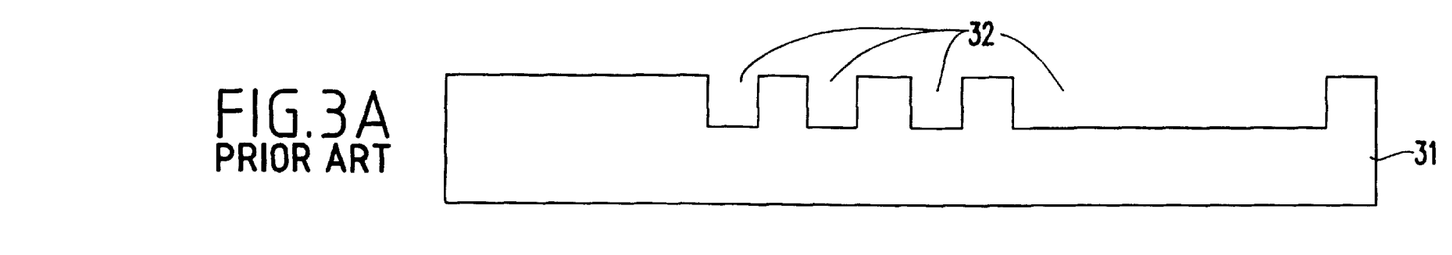
FIGS. 3A–3C illustrate a second conventional process of forming a semiconductor device using metal CMP.
Figure 3B:
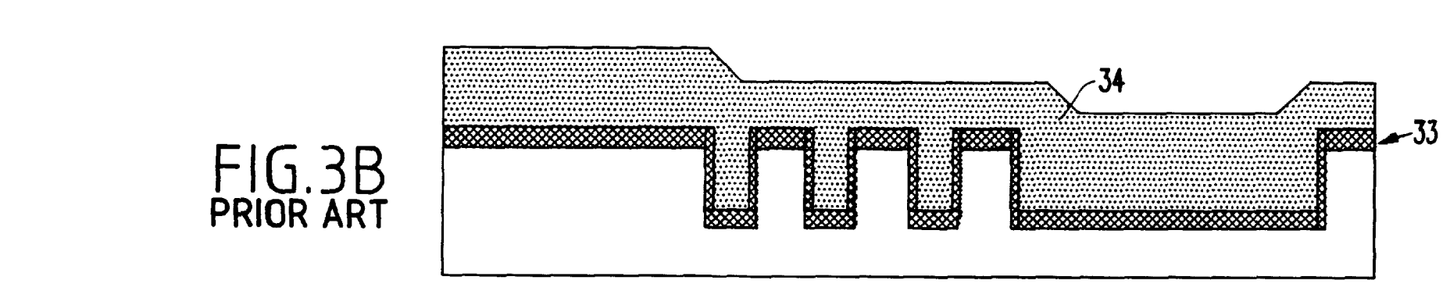
Figure 3C:
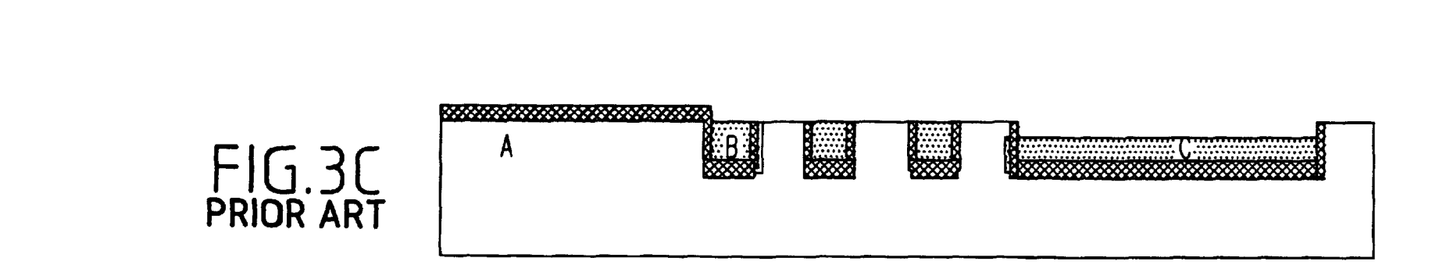

In the case of metal CMP, there is generally an excessive removal of metal in regions with wide metal features (e.g., region C in FIG. 3C), whereas there may be insufficient removal of metal in wide oxide regions (e.g., see region A in FIG. 3C). The excessive thinning of metal results in high resistance, and increased circuit delays. The residual metal on top of the oxide can result in leakage between interconnects.

Thus, the conventional processes result in poor local uniformity of CMP of $SiO_2$ isolations and other structures. As a result, the devices produced may suffer failures.

SUMMARY OF THE INVENTION

In view of the foregoing problems of the conventional methods, an object of the present invention is to provide a method for improving local uniformity of chemical mechanical polishing using a self-aligned polish rate enhancement layer.

In a first aspect of the present invention, a method of making a semiconductor device, includes forming an oxide layer on a silicon substrate, forming a nitride layer over the oxide layer, depositing one of a doped oxide layer and an undoped porous oxide layer on the nitride layer, etching trenches through the one of the doped layer and the undoped porous oxide layer, the nitride layer, and the oxide layer, depositing an undoped oxide layer to fill the trenches, and patterning the undoped oxide by chemical mechanical polishing (CMP).

With the unique and unobvious process of the present invention, uniformity of the CMP results using a self-aligned polishing rate enhancement layer.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Referring now to the drawings, and more particularly to FIGS. 2A–2D, 4A–4C, and 6A–6C, preferred embodiments of the method of forming a semiconductor device according to the invention will be described.

First Embodiment

First, it is noted that the present inventors have found that use of a self-aligned layer enhances the $SiO_2$ polish rate above the pad nitride regions (i.e., active area). This results in a faster polish rate in these regions without altering the polish rate in regions with wide trenches, thereby resulting in a thicker $SiO_2$ layer in the wide trenches after Chemical Mechanical Polishing.

Similarly, a self-aligned layer (e.g., preferably doped $SiO_2$ or porous $SiO_2$) with a fast polish rate can be placed above the pad nitride so that less over-polish is required to remove the $SiO_2$ from regions with wide active areas. A process flow according to the invention is described hereinbelow, with reference to FIGS. 2A–2D. FIG. 2E illustrates a flowchart of the process 200 of the first embodiment. The advantages of such a method will be clear especially when comparing the inventive process with the conventional process shown in FIGS. 1A–1D.

Figure 2A:
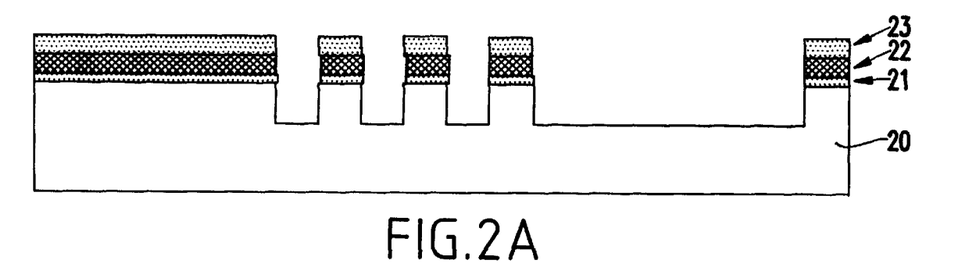
FIGS. 2A–2D illustrate a process of forming a semiconductor device according to a first preferred embodiment of the invention.

Referring to FIG. 2A, first an insulating layer (e.g., preferably $SiO_2$) 21, preferably having a thickness in a range of about 2 nm to about 50 nm, and more preferably about 10 nm, is formed (e.g., grown, for example by thermal oxidation) on a silicon substrate 20 (step 201).

Then, a layer 22 of $Si_3N_4$ is formed (e.g., deposited by Low Pressure Chemical Vapor Deposition (LPCVD)) to a thickness of substantially in a range of about 50 nm to about 300 nm, and more preferably to about 100 nm (step 202).

Thereafter, a layer 23 of doped $SiO_2$ (e.g., Boron-, Phosphorous-, or F-doped) is deposited by, for example, LPCVD to a thickness in a range of about 50 nm to about 300 nm, and more preferably about 100 nm). Alternatively to the doped $SiO_2$, a layer 23 of porous $SiO_2$ (e.g., preferably having a porosity substantially in a range of about 10% to about 80%) may be deposited by a spin-on-glass (SOG) process to a thickness of about 50 nm to about 300 nm, and more preferably to about 100 nm (step 203).

Then, trenches are formed (e.g., etched) through the layers and into Si substrate 20, using Fluorine or Chlorine-based Reactive Ion Etching (RIE) to a trench depth into the Si substrate 20 of about 100 to about 1,000 nm, and more preferably to about 200 nm (step 204).

Figure 2B:
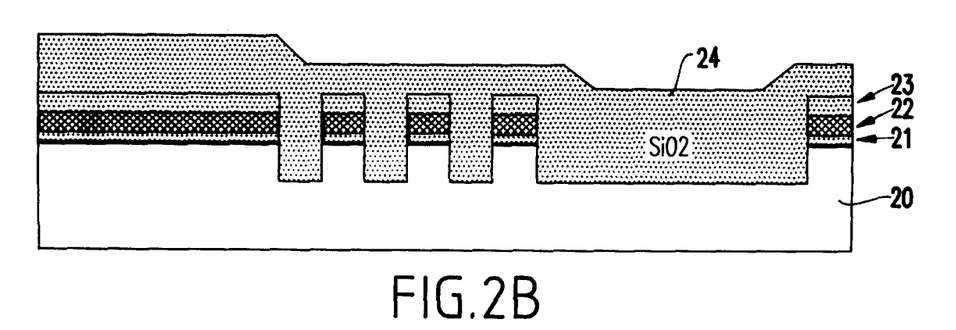

As shown in FIG. 2B, undoped (fill) $SiO_2$ 24 is then formed (e.g., deposited) to fill the trenches, either by LPCVD or SOG to a thickness of about 2 times the trench depth (step 205). At this stage, a high temperature anneal (e.g., performed within a range of about 800 to about 1000° C., for about 1 minute to about 60 minutes) may be used to drive impurities (e.g., Boron, Phosphorous, or Fluorine) into the undoped $SiO_2$ 24 from the underlying doped $SiO_2$ 23 (i.e., self-aligned doping of $SiO_2$).

Figure 2C:
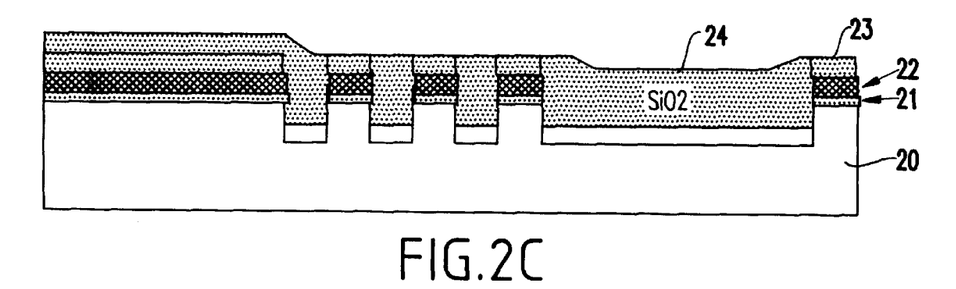

As shown in FIG. 2C, the fill $SiO_2$ 24 is patterned by CMP (e.g., step 206). In general, polishing is stopped when the pad nitride is exposed in all regions. However, if self-aligned doping of $SiO_2$ is used, then the polishing can be stopped before the fill $SiO_2$ 24 is removed from the regions with wide active areas. A selective wet etch (dilute HF) can then by used to remove the doped $SiO_2$ 23.

If porous $SiO_2$ (e.g., between about 10% to about 80% porosity) is used as layer 23 in place of doped $SiO_2$, then the polishing is stopped when the pad nitride is exposed in all regions. It is noted that there will be relatively little thinning of the fill $SiO_2$ 24 in wide trenches during the removal of the porous $SiO_2$ 23 from the wide active areas, due to the high polish rate of porous $SiO_2$ 23 (e.g., about 5 to 10 times higher). Further, the same approach could be used when doped $SiO_2$ forms layer 23, because it also has a higher polish rate than undoped $SiO_2$ (e.g., about 5 to 10 times higher).

Figure 2D:
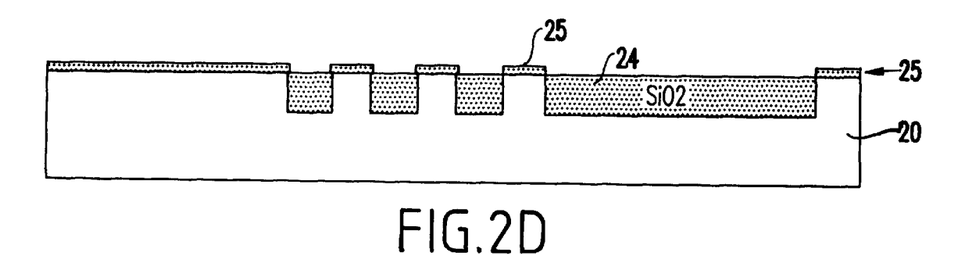
Figure 2E:
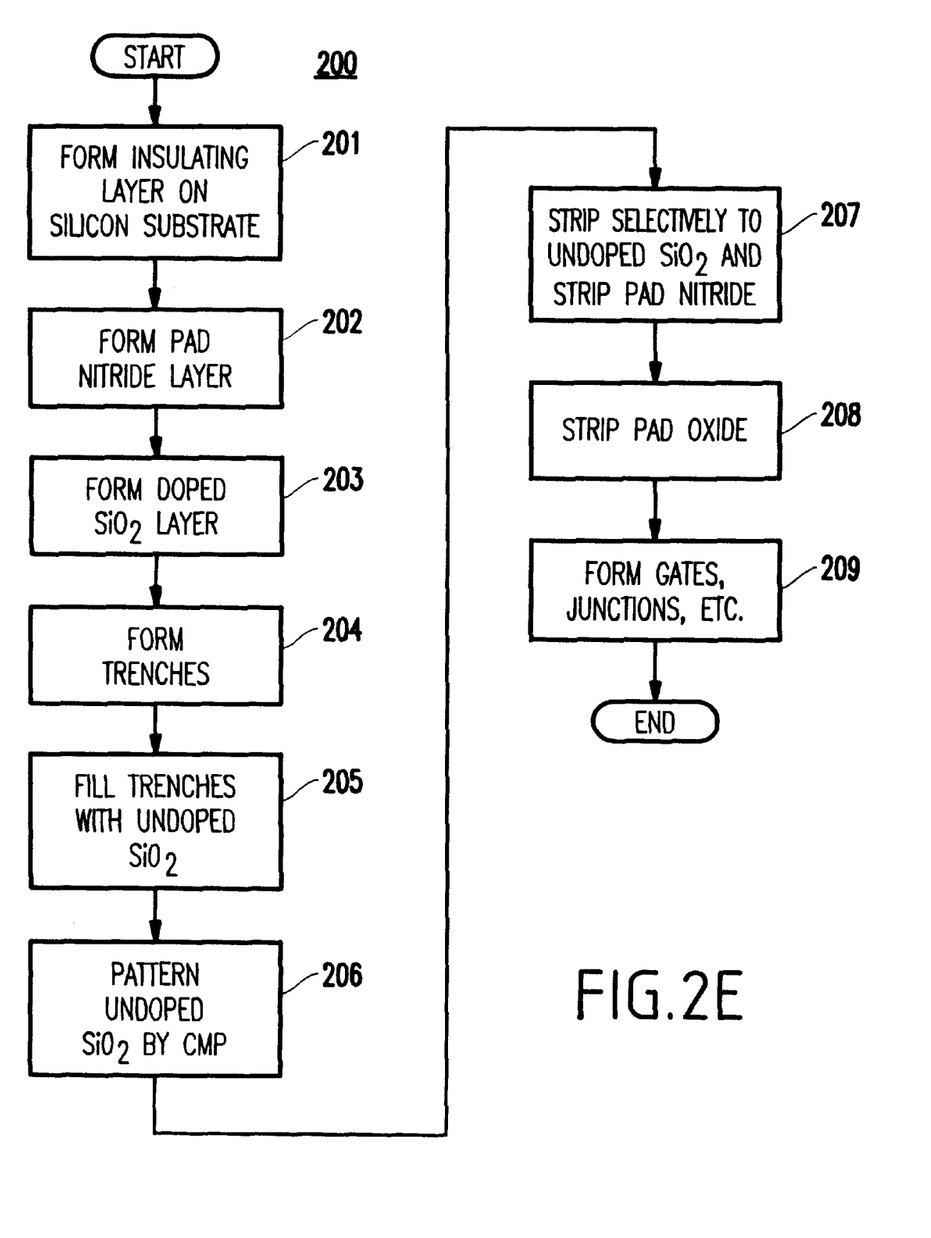
FIG. 2E illustrates a flowchart of the process of the first embodiment.

Thereafter, as shown in FIG. 2D, the doped $SiO_2$ layer 23, if necessary, is stripped selectively to undoped $SiO_2$ using dilute hydrofluoric (HF) acid, and the pad nitride 22 is stripped using $H_3PO_4$ (e.g., step 207). Then, the pad oxide 21 is stripped using, for example, diluted HF, and a sacrificial $SiO_2$ 25 layer is grown as a screen oxide, for subsequent implants, using thermal oxidation (e.g., step 208).

Thereafter, conventional CMOS processing may be used to make gates, junctions, contacts, interconnects, etc. (e.g., step 209)

The process according to the first embodiment of the present invention is relatively simple, and adds only one deposition step (and optionally an extra anneal and wet etch step). The fast removal of the oxide over wide pad nitride regions results in a thicker $SiO_2$ in wide trenches and ensures complete removal of $SiO_2$ in the wide active areas. Thus, the use of doped $SiO_2$ is especially advantageous in enhancing the polishing rate.

A similar method can be used to pattern polysilicon used in filling deep trenches for Dynamic Random storage capacitors. That is, the method of the first embodiment could be modified such that polysilicon fills the trenches rather than $SiO_2$.

Thus, in this modification, the self-aligned underlayer would be doped polysilicon, whereas the material to be polished would be intrinsic polysilicon. The doped polysilicon polishes about 3 times faster than undoped polysilicon, making it easier to remove the undoped polysilicon in wide field regions.

Second Embodiment

Figure 4A:
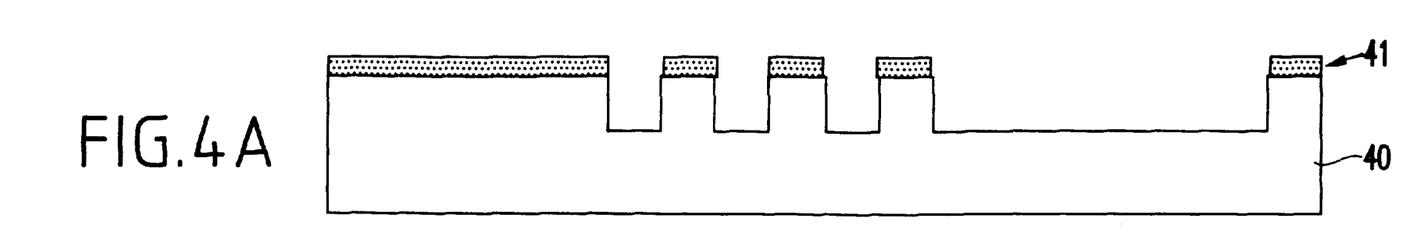
FIGS. 4A–4C illustrate a process of forming a semiconductor device according to a second preferred embodiment of the invention using metal CMP.
Figure 4B:
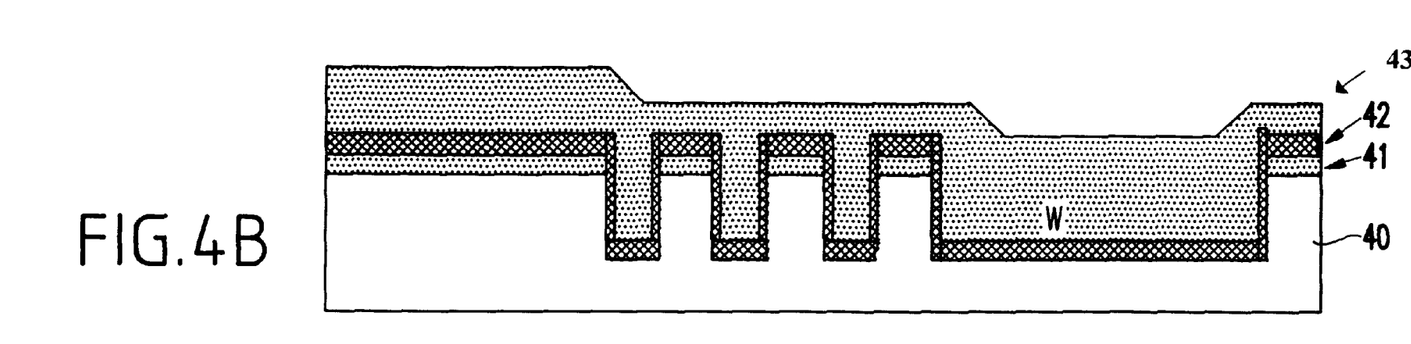
Figure 4C:
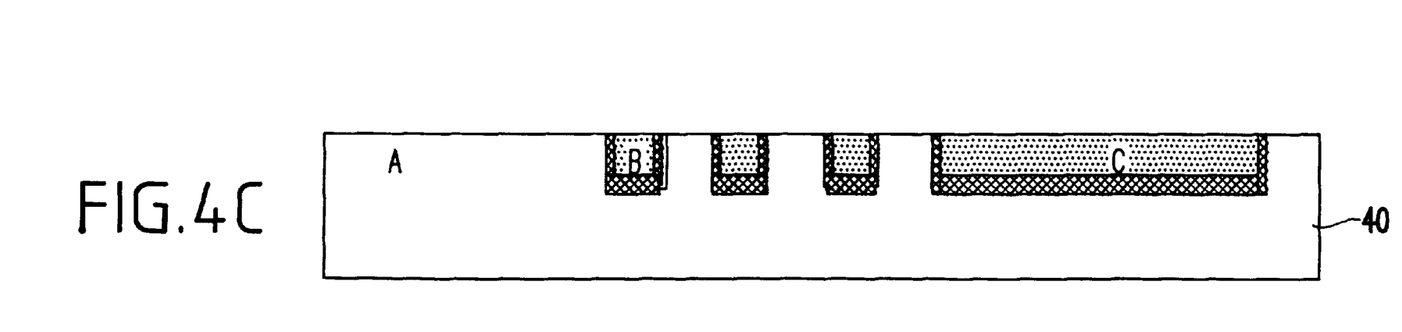
Figures 4D, 6D:
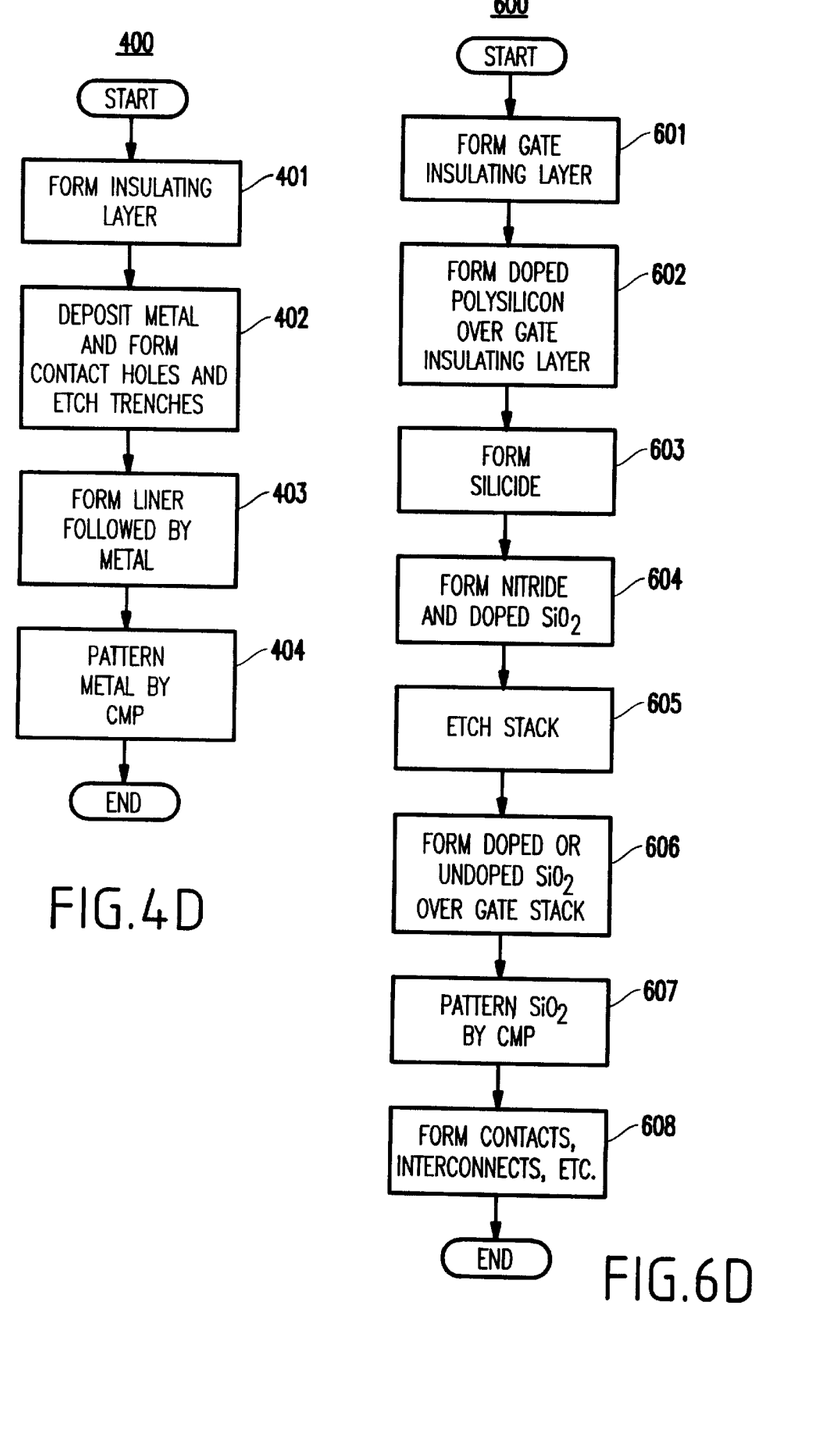
FIG. 4D illustrates a flowchart of the process of the second embodiment.
FIG. 6D illustrates a flowchart of the process of the third embodiment.

A similar approach may be used for metal Chemical Mechanical Polishing, as shown in FIGS. 4A–4C and the flowchart of the process 400 shown in FIG. 4D.

First, as a basis for comparison a conventional metal CMP will be described referring to FIGS. 3A–3C. Referring to FIG. 3A, an interlevel dielectric (ILD) 31 is deposited and then trenches 32 are etched therein.

In FIG. 3B, a titanium/titanium nitride (Ti/TiN) liner 33 is deposited in the trenches 32 along with a conductor (e.g., tungsten) 34, thereby to fill the trenches 32.

In FIG. 3C, the conductor 34 is patterned by CMP.

However, as mentioned above, in the case of metal CMP, there is generally excessive removal of metal in regions with wide metal features (e.g., see region C in FIG. 3C), whereas there may be insufficient removal of metal in wide oxide regions (e.g., see region A in FIG. 3C). The excessive thinning of metal results in high resistance, and increased circuit delays. The residual metal on top of the dielectric 31 (see Region A in FIG. 3C) can result in leakage between interconnects. Region B in FIG. 3C represents a dense array of interconnects.

Thus, for CMP of tungsten (W) in the conventional process, the Ti liner 33 can be difficult to remove because it has a much lower polish rate than W in many slurries (e.g., acidic $Al_2O_3$ slurries), resulting in recessing of the W in wide trenches and residual Ti in regions with wide $SiO_2$.

A self-aligned W layer can be alloyed with the Ti to enhance the W polish rate above the wide oxide regions. This results in a faster polish rate in these regions without altering the polish rate in regions with wide trenches, thereby resulting in a thicker W layer in the wide trenches after CMP.

Similarly, a self-aligned layer with a fast polish rate can be placed above the wide oxide regions so that less over-polish is required to remove the W from regions with wide active areas. A process flow is described below with reference to FIGS. 4A–4C, and a flowchart of the method 400 of the second embodiment is shown in FIG. 4D.

First, as shown in FIG. 4A, an interlevel dielectric (e.g., $SiO_2$ layer) 40 is formed by either LPCVD or by Plasma Chemical Vapor Deposition (PCVD), to a thickness of about 100 nm to about 1,000 nm, and more preferably to about 500 nm (step 401).

Then, a metal layer 41 (e.g., tungsten, Mo, Ta, Al, Zr, Nb, and/or Cu) is deposited by Chemical Vapor Deposition (CVD) or by Physical Vapor Deposition (PVD) to a thickness of about 10 nm to about 500 nm, and more preferably about 50 nm. Thereafter, contact holes and trenches are etched, using F-based Reactive Ion Etching (RIE) (step 402).

In FIG. 4B, a liner 42 and another metal layer 43 are formed thereon (e.g., deposited by PVD or LPCVD) (step 403). It is noted that the liner 42 may be selected depending upon the metal employed. For example, a Ta or TaN liner may be employed with copper, whereas a Ti/TiN liner is typically employed with W or Al conductors. Assuming a Ti/TiN liner, preferably, the titanium in a Ti/TiN liner has a thickness of about 5 nm to about 50 nm, and more preferably about 10 nm. Preferably, the TiN has a thickness of about 5 nm to about 50 nm, and more preferably a thickness of about 10 nm. The tungsten preferably has a thickness of about 2 times the trench depth. At this point, a high temperature anneal (e.g., preferably performed at about 400 to about 800° C., for about 2 hours) may be used to alloy the Ti with the underlying metal).

Then, as shown in FIG. 4C, the tungsten is patterned by CMP (step 404). The polish is stopped when the field oxide is exposed in all regions. It is noted that there will be relatively little thinning of the W in wide trenches during the removal of the Ti from the wide active areas, due to the high polish rate TiW alloy compared to Ti (e.g., about 5 to about 10 times higher). At this point, additional metal interconnect layers could be formed if desired.

The above process shown in FIGS. 4A–4C is relatively simple, and only adds one deposition step (and optionally an extra anneal step). The fast removal of, for example, Ti of the liner 42 over wide oxide regions A results in a thicker W layer 43 in wide trenches (e.g., Region C) and ensures complete removal of liner 42 in wide active areas. Thus, in the second embodiment, using a metal underlayer enhances the polishing rate.

Additionally, extra polishes associated with removing the liner are eliminated using this approach.

Third Embodiment

Figure 6A:
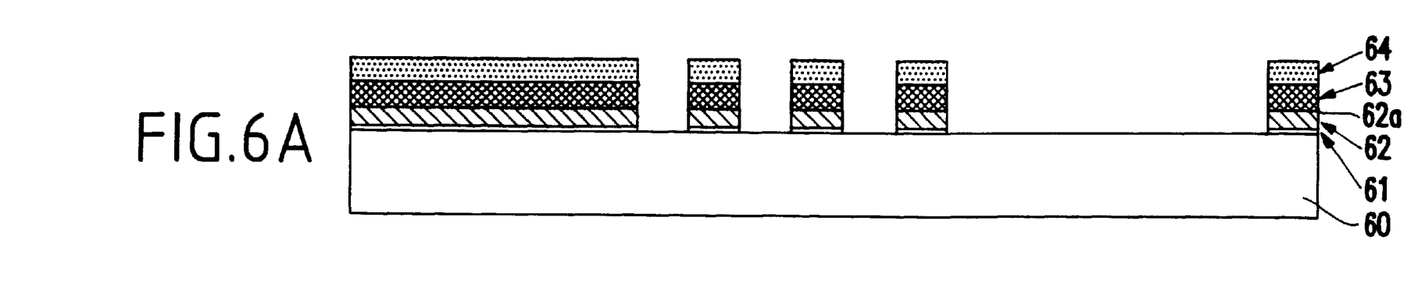
FIGS. 6A–6C illustrate a process of forming a semiconductor device according to a third preferred embodiment of the invention.
Figure 6B:
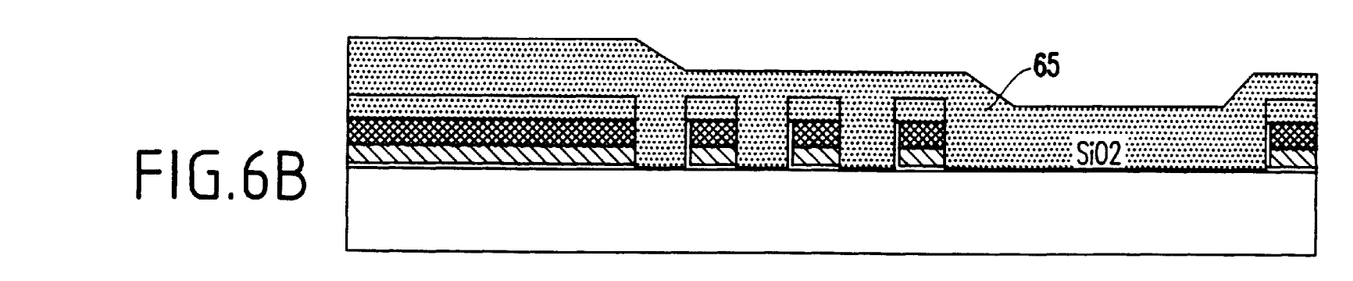
Figure 6C:
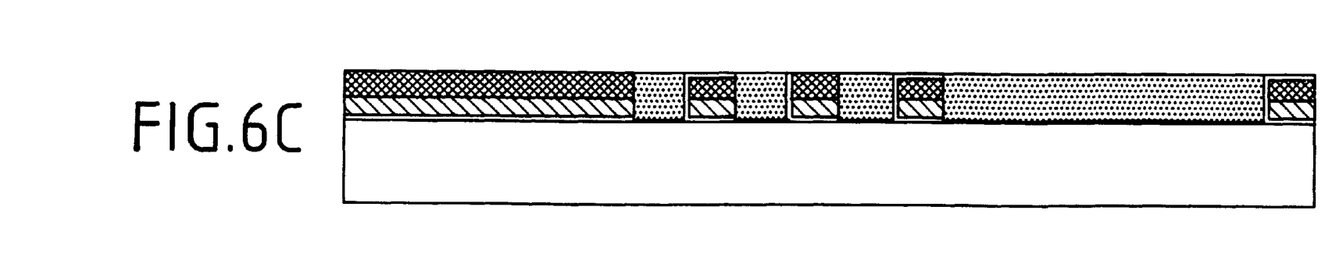

According to a third embodiment of the present invention, this approach also can be used for oxide CMP over a gate stack, where the gate stack is used as a polish stop, as shown in FIGS. 6A–6C.

First, a conventional method of oxide CMP over a gate stack is shown in FIGS. 5A–5D.

Figure 5A:
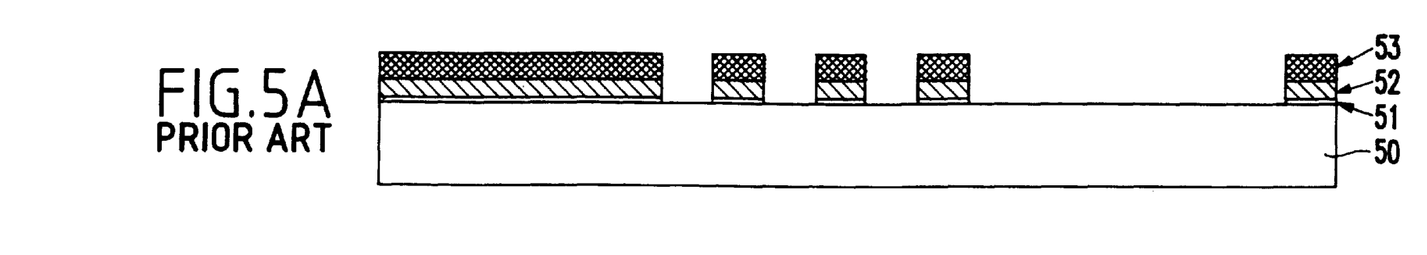
FIGS. 5A–5C illustrate a third conventional process of forming a semiconductor device.

First, in FIG. 5A, over a silicon substrate 50 is formed a $SiO_2$ layer 51, a polysilicon 52 and a SiN layer 53 in turn. The gate stack is patterned, as shown.

Figure 5B:
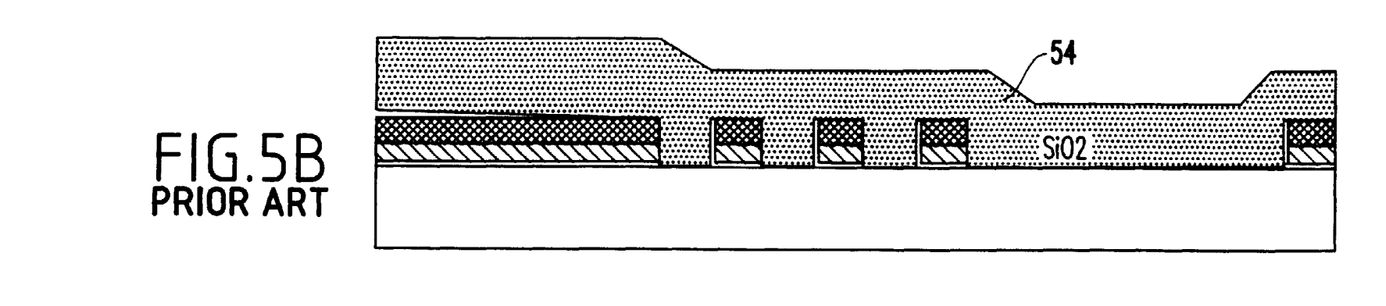

In FIG. 5B, a dielectric 54 is deposited.

Figure 5C:
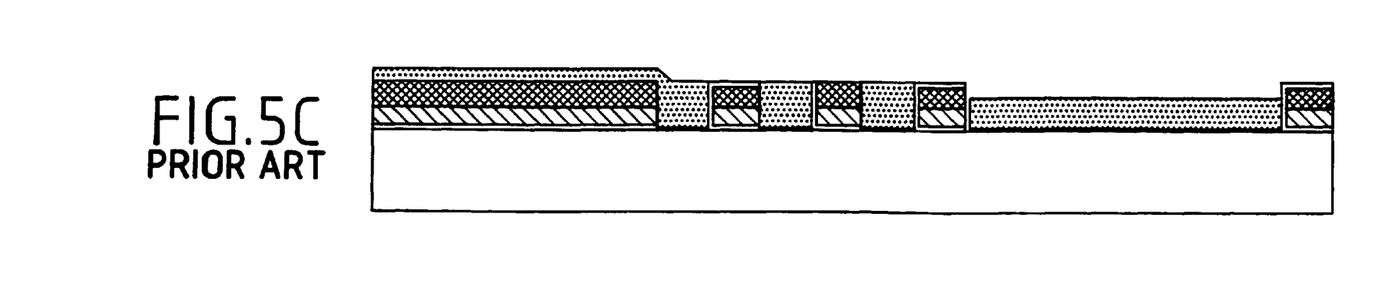

In FIG. 5C, the dielectric 54 is patterned by CMP.

To improve over the conventional process of FIGS. 5A–5C, in the third embodiment, a self-aligned layer 65 of doped $SiO_2$ or porous $SiO_2$ is used to enhance the $SiO_2$ polish rate above the wide gate regions. This results in a faster polish rate in these regions without altering the polish rate in regions with wide trenches, thereby resulting in a thicker $SiO_2$ layer in the wide trenches after CMP. A process flow is described below with reference to FIGS. 6A–6C, and a flowchart of the inventive method 600 according to the third embodiment is shown in FIG. 6D.

As shown in FIG. 6A, first, a gate $SiO_2$ layer 61 is formed (e.g., grown by thermal oxidation), preferably having a thickness in a range of about 2 nm to about 50 nm, and more preferably 5 nm, over a silicon substrate 60 (step 601).

Then, doped polysilicon 62 (B, As, or P-doped) is formed (e.g., deposited by LPCVD) to a thickness in a range of about 20 nm to about 200 nm, and more preferably to about 50 nm (step 602).

A metal such as Ti, W, or Ta is deposited by PVD or LPCVD on the polysilicon 62. Thereafter, a silicide 62a such as $TiSi_2$, $WSi_2$, $TaSi_2$ or the like, is formed (e.g., by heating of the polysilicon and the metal), to a thickness of about 10 nm to about 100 nm, and more preferably to about 50 nm (step 603). The preferred silicide is $WSi_2$ because of high thermal stability and low resistivity.

Then, $Si_3N_4$ 63 is formed (e.g., preferably deposited by LPCVD) to a thickness of about 50 nm to about 300 nm, and more preferably to about 150 nm (step 604).

Doped $SiO_2$ 64 (e.g., B-, P-, or F-doped) is formed (e.g., deposited by LPCVD) to a thickness of about 50 nm to about 300 nm, and more preferably to about 100 nm. Alternatively to doped $SiO_2$, porous $SiO_2$ may be deposited by SOG to a thickness of about 50 nm to about 300 nm, and more preferably to about 100 nm.

Thereafter, the stack is etched using F and Cl-based Reactive Ion Etching (RIE), and junctions, silicides, etc. are formed (e.g., step 605).

Referring to FIG. 6B, doped (e.g., doped with B, P, or F) or undoped $SiO_2$ 65 is formed (e.g., preferably deposited by LPCVD) over the gate stack to a thickness of about 2 times the trench depth (step 606). At this point, a high temperature anneal may be used to drive additional impurities (e.g., B, P, or F) into the fill $SiO_2$ 65 from the underlying doped $SiO_2$ 64 (i.e., self-aligned doping of $SiO_2$).

Referring to FIG. 6C, the fill $SiO_2$ 65 is patterned by CMP (step 607). If self-aligned doping of $SiO_2$ is used, the polishing can be stopped before the fill $SiO_2$ 65 is removed from the regions with wide active areas. A selective wet etch can then be used to remove the doped $SiO_2$ 64.

If porous $SiO_2$ is used as layer 64, then the polish is stopped when the nitride 63 is exposed in all regions. It is noted that there will be relatively little thinning of the $SiO_2$ 65 in wide trenches during the removal of the porous $SiO_2$ 64 from the wide active areas, due to the high polishing rate of porous $SiO_2$ 64 (e.g., about 5 to 10 times higher). Furthermore, it is noted that the same approach could be used when doped $SiO_2$ forms layer 64, because it also has a higher polish rate than undoped $SiO_2$ (e.g., about 5 to 10 times higher).

At this point, conventional CMOS processing would be used to make contacts, interconnects, etc. (step 608).

Thus, with the third embodiment, an oxide CMP over the gates with doped $SiO_2$ is used to enhance the polishing rate.

Moreover, with each of the above-described embodiments, enhanced local uniformity of the CMP results from using a self-aligned polishing rate enhancement layer. The enhanced uniformity of the dielectric improves the yield for contacts to Si. That is, too much over-etching of the contacts damages Si, whereas too little over-etching results in high resistance. If the oxide thickness varies, then it is impossible to optimize the over-etch.

While the invention has been described in terms of several preferred embodiments, those skilled in the art will recognize that the invention can be practiced with modification within the spirit and scope of the appended claims.

What is claimed is:

1. A method of making a semiconductor device, comprising:

forming an oxide layer on a silicon substrate;

forming a nitride layer over said oxide layer;

depositing an enhancing layer comprising one of a doped oxide layer and an undoped porous oxide layer, on said nitride layer;

etching trenches through said enhancing layer, said nitride layer, and said oxide layer;

depositing a selectively enhanced layer comprising an undoped oxide layer to fill the trenches; and patterning said selectively enhanced layer by chemical mechanical polishing (CMP).

2. The method according to claim 1, wherein, with said doped oxide layer, the CMP is stopped before the doped oxide layer is removed from regions with predetermined wide active areas.

3. The method according to claim 1, wherein with said porous oxide layer, the CMP is stopped when the nitride layer is exposed in all regions.

4. The method according to claim 2, further comprising:

stripping said doped oxide layer selectively to said undoped oxide layer, stripping said nitride layer, and stripping said undoped oxide layer, and growing a sacrificial oxide layer for subsequent implants.

5. The method according to claim 1, wherein said doped oxide layer comprise doped $SiO_2$.

6. The method according to claim 1, wherein said selectively enhanced layer comprises polysilicon.

7. The method according to claim 6, wherein said enhancing layer comprises doped polysilicon, and said selectively enhanced layer comprises intrinsic polysilicon.

8. The method according to claim 1, wherein said oxide layer has a thickness in a range of about 2 nm to about 50 nm.

9. The method according to claim 8, wherein said oxide layer has a thickness of about 10 nm.

10. The method according to claim 1, wherein said nitride layer comprises a layer of $Si_3N_4$ deposited by Low Pressure Chemical Vapor Deposition (LPCVD) to a thickness of substantially in a range of about 50 nm to about 300 nm.

11. The method according to claim 10, wherein said nitride layer has a thickness of about 100 nm.

12. The method according to claim 1, wherein said doped oxide layer comprises a doped $SiO_2$ layer deposited to a thickness in a range of about 50 nm to about 300.

13. The method according to claim 12, wherein said doped oxide layer has a thickness of about 100 nm.

14. The method according to claim 1, wherein said porous oxide layer comprises a porous $SiO_2$ layer deposited to a thickness of about 50 nm to about 300 nm.

15. The method according to claim 14, wherein said porous oxide layer has a thickness of about 100 nm.

16. The method according to claim 1, wherein said trenches are etched to have a depth of about 100 to about 1,000 nm.

17. The method according to claim 16, wherein said trenches have a depth of about 200 nm.

18. The method according to claim 1, wherein said undoped oxide layer comprises an undoped $SiO_2$ layer deposited to fill the trenches to a thickness of about twice a depth of a trench, and said method further comprising a high temperature anneal for selectively driving impurities into the undoped $SiO_2$ layer from the doped oxide layer, thereby resulting in self-aligned doping of said undoped $SiO_2$ layer.

19. The method according to claim 1, further comprising:

annealing said device to drive impurities from said enhancing layer into said enhanced layer to form self-aligned doped portions of said selectively enhanced layer.

20. The method according to claim 19, wherein a chemical mechanical polishing (CMP) rate is higher in said self-aligned doped portions than in undoped portions of said selectively enhanced layer.

\* \* \* \* \*